(12) United States Patent
Zhou

(10) Patent No.: US 10,515,268 B2
(45) Date of Patent: Dec. 24, 2019

(54) ELECTRONIC DEVICE

(71) Applicant: GUANGDONG OPPO MOBILE TELECOMMUNICATIONS CORP., LTD., Dongguan, Guangdong (CN)

(72) Inventor: Yibao Zhou, Dongguan (CN)

(73) Assignee: GUANGDONG OPPO MOBILE TELECOMMUNICATIONS CORP., LTD., Dongguan, Guangdong (CN)

( * ) Notice: Subject to any disclaimer, the term of this patent is extended or adjusted under 35 U.S.C. 154(b) by 30 days.

(21) Appl. No.: 15/974,077

(22) Filed: May 8, 2018

(65) Prior Publication Data

US 2019/0012542 A1 Jan. 10, 2019

(30) Foreign Application Priority Data

Jul. 10, 2017 (CN) .......................... 2017 1 0555156

(51) Int. Cl.
*H01L 27/32* (2006.01)
*H04N 5/232* (2006.01)
(Continued)

(52) U.S. Cl.
CPC ......... *G06K 9/00604* (2013.01); *G06F 3/042* (2013.01); *H01L 27/3213* (2013.01); *H01L 27/3218* (2013.01); *H01L 27/3225* (2013.01); *H01L 27/3234* (2013.01); *H01L 27/3241* (2013.01); *H01L 27/3248* (2013.01); *H01L 27/3262* (2013.01); *H01L 27/3265* (2013.01); *H01L 27/3276* (2013.01); *H01L 51/0085* (2013.01); *H04N 5/23248* (2013.01); *H04N 5/33* (2013.01); *H01L 27/124* (2013.01); *H01L 27/1255* (2013.01); *H01L 51/0096* (2013.01); *H01L 51/5016* (2013.01); *H01L 51/5206* (2013.01); *H01L 51/5218* (2013.01); *H01L 51/5221* (2013.01); *H01L 51/5234* (2013.01);
(Continued)

(58) Field of Classification Search
CPC .. H04N 5/33; G06K 9/00604; H01L 27/3262; H01L 27/3265; H01L 27/3234
See application file for complete search history.

(56) References Cited

U.S. PATENT DOCUMENTS

2010/0289885 A1 11/2010 Lu
2011/0043487 A1* 2/2011 Huang ................. G06F 3/0412
345/175

(Continued)

FOREIGN PATENT DOCUMENTS

CN 103150565 A 6/2013
CN 104009067 A 8/2014
(Continued)

OTHER PUBLICATIONS

International Search Report in international application No. PCT/CN2018/084169, dated Jun. 28, 2018.
(Continued)

*Primary Examiner* — Tsion B Owens
(74) *Attorney, Agent, or Firm* — Ladas & Parry, LLP

(57) ABSTRACT

An electronic device includes an iris camera; and an organic light-emitting diode (OLED) display screen, in which an infrared OLED is integrated, wherein the infrared OLED is configured to emit infrared light to assist the iris camera in acquisition of an iris image.

16 Claims, 5 Drawing Sheets

(51) Int. Cl.
    *G06K 9/00*         (2006.01)
    *G06F 3/042*       (2006.01)
    *H01L 51/00*       (2006.01)
    *H04N 5/33*        (2006.01)
    *H01L 27/12*       (2006.01)
    *H01L 51/50*       (2006.01)
    *H01L 51/52*       (2006.01)

(52) U.S. Cl.
    CPC .. *H01L 2251/301* (2013.01); *H01L 2251/308* (2013.01); *H01L 2251/5307* (2013.01); *H01L 2251/5315* (2013.01)

(56) References Cited

U.S. PATENT DOCUMENTS

| | | |
|---|---|---|
| 2012/0146953 A1 | 6/2012 | Yi |
| 2013/0250103 A1 | 9/2013 | Lu et al. |
| 2015/0092059 A1 | 4/2015 | Lu et al. |
| 2016/0180169 A1* | 6/2016 | Bae ............... G06K 9/00604 382/117 |
| 2016/0373664 A1 | 12/2016 | Wei |
| 2017/0297490 A1* | 10/2017 | Lynam ............... B60K 35/00 |
| 2018/0302575 A1 | 10/2018 | Lu et al. |

FOREIGN PATENT DOCUMENTS

| | | |
|---|---|---|
| CN | 204102153 U | 1/2015 |
| CN | 107330415 A | 11/2017 |
| KR | 20120116088 A | 10/2012 |

OTHER PUBLICATIONS

English Translation of the Written Opinion of the International Search Authority in international application No. PCT/CN2018/084169, dated Jun. 28, 2018.

Supplementary European Search Report in European application No. 18170023.8, dated Oct. 25, 2018.

* cited by examiner

ELECTRONIC DEVICE

CROSS-REFERENCE TO RELATED APPLICATIONS

This application is based upon and claims priority to Chinese Patent Application No. 201710555156.X filed on Jul. 10, 2017, the entire contents of which are incorporated herein by reference.

TECHNICAL FIELD

The present disclosure relates to the technical field of biometric recognition, and more particularly, to an electronic device.

BACKGROUND

An iris camera in an electronic device requires an arranged supplementary lighting lamp to meet a supplementary lighting requirement of the camera. For arranging the supplementary lighting lamp, a hole is defined in a mobile phone, so that attractive appearance of the electronic device is further influenced.

BRIEF DESCRIPTION OF DRAWINGS

The abovementioned and/or additional aspects and advantages of the present disclosure become obvious and easy to understand from the descriptions made to the embodiments in combination with the following drawings, wherein modifications of the drawings and graphic descriptions in the specification are added.

DETAILED DESCRIPTION

Figure 1:
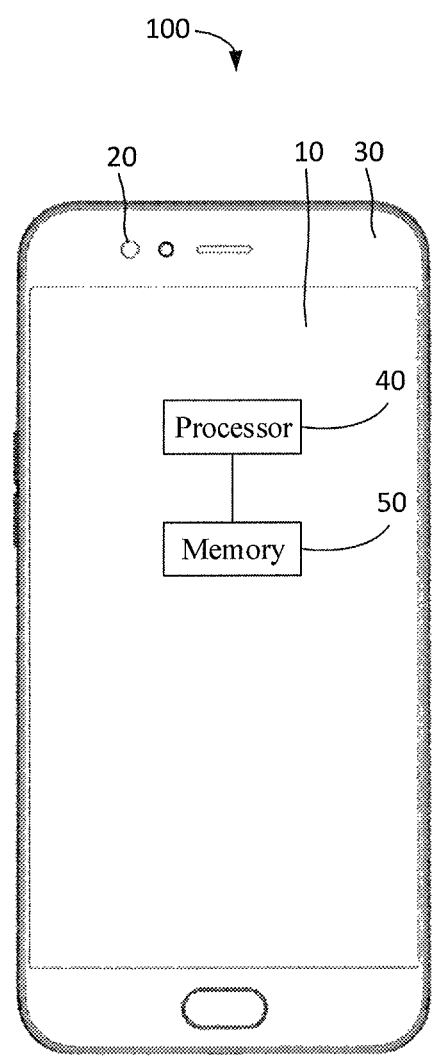
FIG. 1 is a plan view illustrating an electronic device according to an embodiment of the present disclosure.

Embodiments of the present disclosure will be described below in detail, and are illustrated in the drawings, in which the same or similar numbers always represent the same or similar components or components with the same or similar functions. The embodiments described with reference to the drawings below are exemplary and explanatory only and are not intended to be limiting of the present disclosure.

As used in the description of the present disclosure, it is important to understand that orientation or position relationships indicated by terms "center", "longitudinal", "transverse", "length", "width", "thickness", "upper", "lower", "front", "rear", "left", "right", "vertical", "horizontal", "top", "bottom", "inner", "outer", "clockwise", "counter-clockwise" and the like are orientation or position relationships shown on the basis of the drawings. Those are intended not to indicate or imply that related devices or components are required to be at specific orientations and structured and operated at the specific orientations but only to facilitate description about the present disclosure and simplify description, and thus may not be understood as limits to the present disclosure. In addition, terms "first" and "second" are only adopted for the objective of description, and may not be understood to indicate or imply relative importance or implicitly indicate a number of indicated technical features. Therefore, features limited by "first" and "second" may explicitly or implicitly include one or more such features. In the descriptions of the present disclosure, "multiple" means two or more than two, unless otherwise explicitly and specifically limited.

In the descriptions about the present disclosure, it is important to note that, unless otherwise explicitly specified and limited, terms "mount", "mutually connect" and "connect" should be broadly understood. For example, they may refer to fixed connection, detachable connection or integrated connection. They may also refer to mechanical connection, electrical connection or mutual communication. They may refer to direct connection, indirect connection through an intermediate, communication in two components, or an interaction relationship of the two components. For those skilled in the art, specific meanings of these terms in the present disclosure may be understood according to specific conditions.

In the present disclosure, unless otherwise explicitly specified and limited, that a first feature is "over" or "under" a second feature may include that the first and second features directly contact, or the first and second features do not directly contact but contact through another feature therebetween. Moreover, that the first feature is "over", "above" and "on an upper part of" the second feature includes that the first feature is over and obliquely above the second feature, or only represents that a horizontal height of the first feature is greater than the second feature. That the first feature is "under", "below" and "on a lower part of" the second feature includes that the first feature is under and obliquely below the second feature, or only represents that the horizontal height of the first feature is less than the second feature.

The present disclosure described below provides many different embodiments or examples to implement different structures of the present disclosure. For simplifying the present disclosure, parts and settings of specific examples will be described below. Of course, they are merely examples and not intended to limit the present disclosure. In addition, reference numbers and/or reference letters may be repeated in different examples of the present disclosure, and such repetitions are made for the objectives of simplification and clarification, and do not indicate relationships between various embodiments and/or settings which are discussed. Moreover, the present disclosure provides examples of various specific processes and materials, but those skilled in the art may realize application of other processes and/or use of other materials.

The disclosure relates to an electronic device. The electronic device can include an iris camera; and an organic light-emitting diode (OLED) display screen, in which an infrared OLED is integrated, wherein the infrared OLED is configured to emit infrared light to assist the iris camera in acquisition of an iris image.

In at least one embodiment, the electronic device may further include a casing, wherein the OLED display screen and the iris camera may be arranged on the casing and separated from each other.

In at least one embodiment, the electronic device may further include a processor and a memory, wherein the electronic device is a full-screen display electronic device; the iris camera may be configured to receive infrared light which is reflected by an iris and penetrates through the OLED display screen, and obtain an initial image; wherein the initial image contains iris image information corresponding to an iris image and component information of the OLED display screen; the memory may be configured to store prestored image information captured for the OLED display screen when no image is displayed on the OLED display screen, wherein the prestored image information may be the component information of the OLED display screen; and the processor may be configured to remove the component information of the OLED display screen from the initial image according to the prestored image information stored in the memory, and obtain the iris image information to acquire the iris image.

In at least one embodiment, the electronic device may further include a processor and a memory, wherein the electronic device is a full-screen display electronic device, the iris camera may be configured to receive infrared light which is reflected by an iris and penetrates through the OLED display screen, and obtain an initial image; wherein the initial image contains iris image information corresponding to an iris image, component information of the OLED display screen and display image information when an image is displayed on the OLED display screen; the memory may be configured to store prestored image information captured for the OLED display screen when no image is displayed on the OLED display screen, wherein the prestored image information may be the component information of the OLED display screen; and the processor may be configured to acquire the display image information in real time, remove the display image information from the initial image, remove the component information from the initial image according to the prestored image information stored in the memory, and obtain the iris image information to acquire the iris image.

In at least one embodiment, the infrared OLED may be arranged as follows: the infrared OLED is integrated at a location on the OLED display screen closest to the iris camera; the infrared OLED is integrated at a specific distance from the iris camera; or the infrared OLED is integrated at an edge of the OLED display screen.

In at least one embodiment, the specific distance may be 10 mm or 15 mm.

In at least one embodiment, the OLED display screen may include multiple pixel cells for displaying image information, wherein each of the pixel cells may include a red OLED, a blue OLED, a green OLED and an infrared OLED.

In at least one embodiment, the OLED display screen may include multiple pixel cells for displaying image information, wherein each of the pixel cells may include a red OLED, a blue OLED, and a green OLED; and the infrared OLED may be integrated between the pixel cells or integrated at edge positions of the OLED display screen.

In at least one embodiment, the electronic device may further include a processor; wherein the processor may be configured to control the multiple pixel cells to display the image information, and control the infrared OLED to be turned off; or the processor may be configured to control the infrared OLED to emit the infrared light, and control the pixel cells to stop working.

In at least one embodiment, the red OLED, the green OLED and the blue OLED may be distributed in a Bayer array.

In at least one embodiment, the OLED display screen may include: a substrate, on which the infrared OLED may be arranged; wherein the infrared OLED may include: a first transistor, a second transistor, a storage capacitor, a first electrode layer electrically connected with the second transistor, an organic light-emitting layer positioned on the first electrode layer and a second electrode layer positioned on a surface of the organic light-emitting layer.

In at least one embodiment, when the OLED display screen is working, the first transistor may act as a switching transistor; the second transistor may act as a driving transistor; a source of the first transistor may be connected to a data line, a gate of the first transistor may be connected to a gate line, and a drain of the first transistor may be connected to one end of the storage capacitor and a gate of the second transistor; a source of the second transistor may be connected to the first electrode layer; the first electrode layer may be a positive electrode of the infrared OLED; and the infrared OLED may be controlled to be turned on or off under pulse signals on the data line and the gate line.

In at least one embodiment, the OLED display screen may be a top-emitting type OLED display screen, or a bottom-emitting type OLED display screen, when the OLED display screen is the top-emitting type OLED display screen, the first electrode layer may be a metal conducting layer, the second electrode layer may be a transparent electrode layer, and light emitted from the organic light-emitting layer may be emitted to the second electrode layer along the first electrode layer; and when the OLED display screen is the bottom-emitting type OLED display screen, the first electrode layer may be the transparent electrode layer, the second electrode layer may be the metal conducting layer, and light emitted from the organic light-emitting layer may be emitted to the first electrode layer along the second electrode layer.

In at least one embodiment, the metal conducting layer may be made of a metal conducting material with a high reflectivity, and the metal conducting material may include at least one of: Platinum, Palladium, Ir, Aurum, Wolfram, Nickel, Argentum or Aluminum.

In at least one embodiment, the transparent electrode layer may be made of a transparent electrode material, and the transparent electrode material may include at least one of: Indium Tin Oxide or Indium Zinc Oxide.

In at least one embodiment, the substrate may be a transparent substrate, and the substrate may be formed from any one of: glass, a sapphire, polymethyl methacrylate, polycarbonate or polycarbonate/polymethyl methacrylate.

In at least one embodiment, the organic light-emitting layer may be made of a triplet rare metal compound.

In at least one embodiment, the organic light-emitting layer may be made of an Ir(III) compound.

In at least one embodiment, the electronic device may include: a mobile phone, a tablet computer, a notebook computer, a smart watch, a smart band, smart glasses, or a smart helmet.

Referring to FIG. 1, an electronic device 100 of an embodiment of the present disclosure includes an OLED display screen 10 and an iris camera 20, wherein an infrared OLED 12 is integrated in the OLED display screen 10, and the infrared OLED 12 is configured to emit infrared light to assist the iris camera 20 in acquisition of an iris image.

Figure 2:
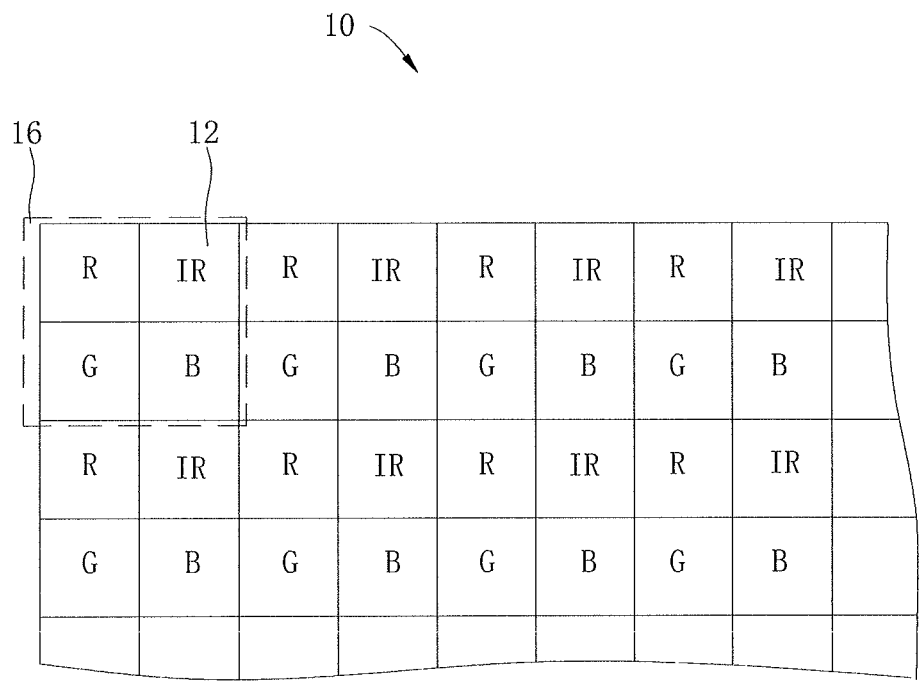
FIG. 2 is a schematic diagram illustrating an OLED display screen according to an embodiment of the present disclosure.
Figure 3:
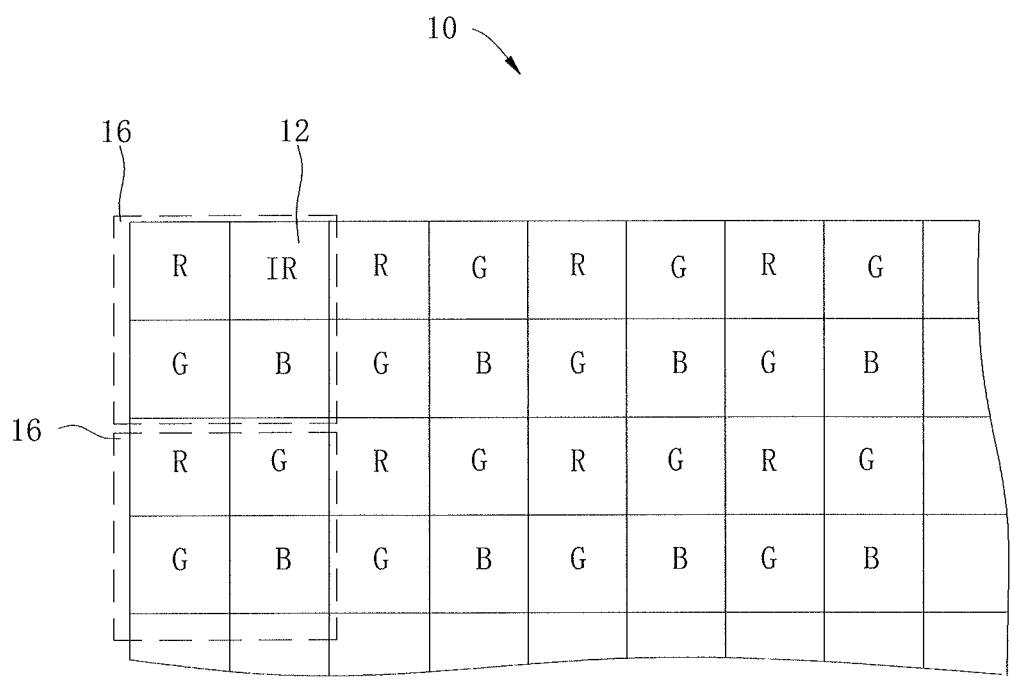
FIG. 3 is a schematic diagram illustrating an OLED display screen according to another embodiment of the present disclosure.
Figure 4:
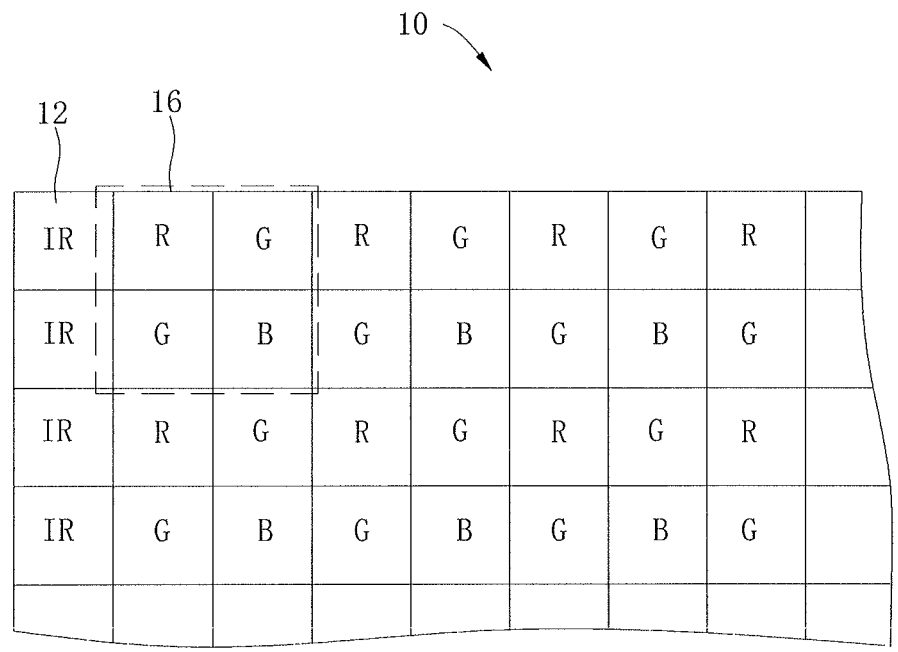
FIG. 4 is a schematic diagram illustrating an OLED display screen according to another embodiment of the present disclosure.
Figure 5:
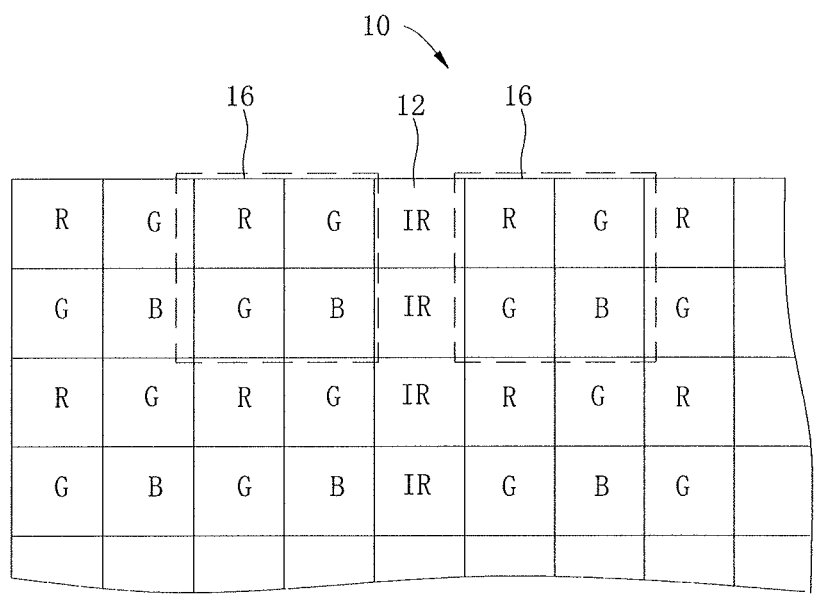
FIG. 5 is a schematic diagram illustrating an OLED display screen according to an additional embodiment of the present disclosure.

Specifically, the OLED display screen 10 includes multiple pixel cells 16. As shown in FIG. 2 and FIG. 3, each of one or more pixel cells 16 in the OLED display screen 10 includes a red OLED component, a blue OLED component, a green OLED component and an infrared OLED 12. Or, as shown in FIG. 4 and FIG. 5, each of the pixel cells 16 only includes a red OLED component, a blue OLED component and a green OLED component, and one or more infrared OLEDs 12 are integrated between the pixel cells 16 (as shown in FIG. 5) or integrated at edge positions of the OLED display screen 10 (as shown in FIG. 4).

According to the electronic device 100 of an embodiment of the present disclosure, the infrared OLED 12 is integrated in the OLED display screen 10 to assist the iris camera 20 in acquisition of the iris image, so that the infrared OLED 12 is not required to additionally occupy a volume outside the OLED display screen 10, defining a hole in an outer surface of the electronic device 100 is avoided, and the electronic device 100 is more attractive in appearance.

Figure 6:
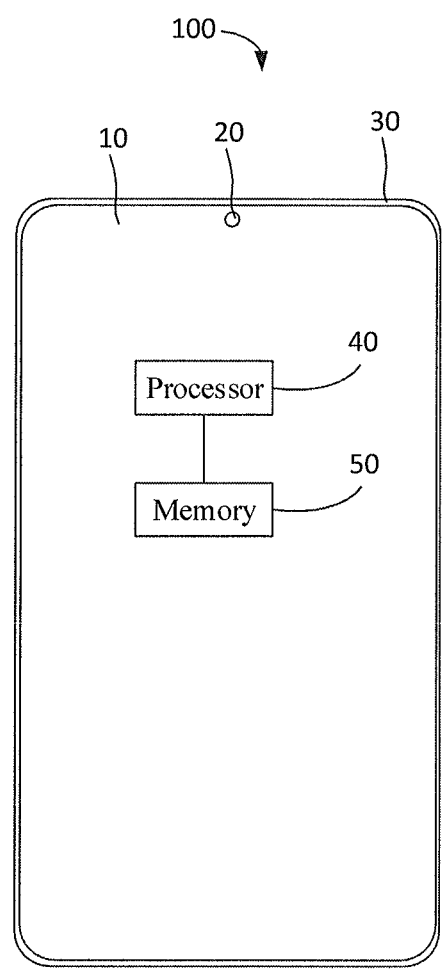
FIG. 6 is a plan view illustrating an electronic device according to another embodiment of the present disclosure.
Figure 7:
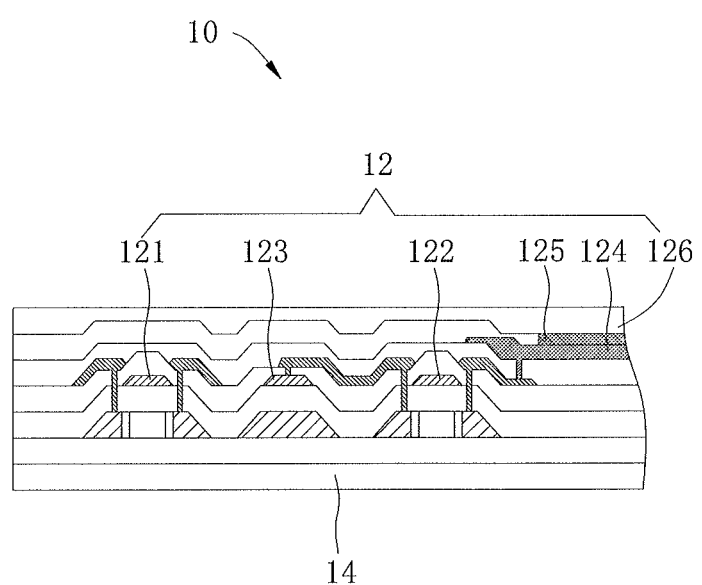
FIG. 7 is a sectional view illustrating an OLED display screen according to an embodiment of the present disclosure.

Referring to FIG. 1, an electronic device 100 of an embodiment of the present disclosure includes an OLED display screen 10, an iris camera 20 and a casing 30. The electronic device 100 includes a mobile phone, a tablet computer, a notebook computer, a smart watch, a smart band, smart glasses, a smart helmet and the like. In some embodiments of the present disclosure, the electronic device 100 is a mobile phone. Specifically, the electronic device 100 may be a full-screen mobile phone (as shown in FIG. 6) or a non-full-screen mobile phone (as shown in FIG. 1). Referring to FIG. 7, the OLED display screen 10 includes an infrared OLED 12 and a substrate 14.

The substrate 14 is a transparent substrate. Specifically, the substrate 14 may be formed from any one of glass, a sapphire, polymethyl methacrylate (PMMA), polycarbonate (PC) or PC/PMMA.

The infrared OLED 12 is arranged on the substrate 14, and is configured to emit infrared light. The infrared OLED 12 includes a first transistor 121, a second transistor 122, a storage capacitor 123, a first electrode layer 124 electrically connected with the second transistor 122, an organic light-emitting layer 125 positioned on the first electrode layer 124, and a second electrode layer 126 positioned on a surface of the organic light-emitting layer 125.

In some embodiments, the OLED display screen 10 may be a top-emitting type OLED display screen, or may also be a bottom-emitting type OLED display screen. When the OLED display screen 10 is a top-emitting type OLED display screen, the first electrode layer 124 is a metal conducting material with a high reflectivity, and its material may be Platinum (Pt), Palladium (Pd), Ir, Aurum (Au), Wolfram (W), Nickel (Ni), Argentum (Ag) or Aluminum (Al). The second electrode layer 126 is a transparent electrode, and a material of the transparent electrode may be a thin film including a transparent conducting material such as Indium Tin Oxide (ITO) or Indium Zinc Oxide (IZO). At this moment, light emitted from the organic light-emitting layer 125 is emitted to a direction of the second electrode layer 126 along the first electrode layer 125. When the OLED display screen 10 is a bottom-emitting type OLED display screen, the first electrode layer 124 is a transparent electrode layer, and the second electrode layer 126 is a metal conducting layer with high reflectivity, so that the light emitted from the organic light-emitting layer 125 may be emitted to a direction of the first electrode layer 124 along the second electrode layer 126 to form the bottom-emitting type OLED display screen. A material of the organic light-emitting layer 125 may be a triplet rare metal compound. In at least one embodiment, the organic light-emitting layer 125 may be an Ir(III) compound. A number of the infrared OLED 12 may be one or more.

When the OLED display screen 10 is working, the first transistor 121 acts as a switching transistor, the second transistor 122 acts as a driving transistor, a source of the first transistor 121 is connected to a data line, its gate is connected to a gate line, and its drain is connected to one end of the storage capacitor 123 and a gate of the second transistor 122. A source of the second transistor 122 is connected to the first electrode layer 124. In an embodiment, the first electrode layer 124 is a positive electrode of an OLED structure. The infrared OLED 12 is controlled to be turned on or off under pulse signals on the data line and the gate line.

The iris camera 20 may receive the infrared light reflected by an iris, and is configured to generate an iris image. The infrared OLED 12 may be used as an infrared supplementary lighting lamp of the iris camera 20. In at least one embodiment, the infrared OLED 12 is configured to emit the infrared light, and may assist the iris camera 20 in acquisition of the iris image.

Referring to FIG. 1 and FIG. 6, the OLED display screen 10 and the iris camera 20 are arranged on the casing 30 at intervals including but not limited to a separated mode, i.e. the OLED display screen 10 and the iris camera 20 are separated from each other. In at least one embodiment, the infrared OLED 12 is integrated in the OLED display screen 10 as follows. For example, the infrared OLED 12 is integrated at a location on the OLED display screen 10 closest to the iris camera 20, wherein the closest position refers to a position immediately adjacent to the iris camera 20, a position surrounding an edge of the iris camera 20, a position with the shortest straight line distance from the iris camera 20, or the like. Or the infrared OLED 12 is integrated at a specific distance from the iris camera 20 (for example, 10 mm and 15 mm). Or the infrared OLED 12 is integrated at an edge of the OLED display screen 10.

According to the electronic device 100 of an embodiment of the present disclosure, the infrared OLED 12 is integrated in the OLED display screen 10 to assist the iris camera 20 in acquisition of the iris image, so that the infrared OLED 12 is not required to additionally occupy a volume outside the OLED display screen 10, defining a hole in an outer surface of the electronic device 100 is avoided, and the electronic device 100 is more attractive in appearance.

Referring to FIG. 6, in certain embodiments, the electronic device 100 is a full-screen display electronic device, the electronic device 100 further includes a processor 40. A light path of infrared light received by the iris camera 20 penetrates through the OLED display screen 10. The infrared light is reflected by the iris and penetrates through the OLED display screen 10, and the iris camera 20 receives the infrared light which penetrates through the OLED display screen 10 to output an initial image including iris information. The processor 40 is configured to process the initial image to obtain the iris image only including the iris information outside the electronic device 100.

In at least one embodiment, the light path of the infrared light received by the iris camera 20 sequentially includes: an external side of the electronic device 100, the OLED display screen 10 and the iris camera 20. The infrared light emitted from the infrared OLED 12 may be received by the iris camera 20 only after being reflected by the iris outside the electronic device 100 and penetrating through the OLED display screen 10. Therefore, when the infrared light reflected by the iris penetrates through the OLED display screen 10, the infrared light may be influenced by a component on the OLED display screen 10 (for example, a line and diode on the OLED display screen 10) and a display picture on the OLED display screen 10 when the image picture is displayed on the OLED display screen 10. The initial image acquired by the iris camera 20 includes the iris information outside the electronic device 100, component information of the OLED display screen 10, display picture information of the OLED display screen 10 and the like. The processor 40 may process the initial image to remove an interference signal included in the initial image and obtain an iris image only including the iris information outside the electronic device 100, so that an accuracy of the iris image is improved.

Referring to FIG. 1, in certain embodiments, the acquired initial image includes the iris information and display image information when an image is displayed on the OLED display screen 10. The processor 40 is configured to acquire the display image information in real time when the image is displayed on the OLED display screen 10, and remove the display image information to obtain the iris image when the initial image is processed.

In at least one embodiment, when the image picture is displayed on the OLED display screen 10, the initial image acquired by the iris camera 20 includes information corresponding to the display image information. The processor 40 acquires the display image information in real time when the image is displayed on the OLED display screen 10 to obtain the display image information contained in the initial image. Therefore, the processor 40 may remove the display image information in information of the initial image to obtain the iris image according to the display image information acquired by the processor 40.

Referring to FIG. 1, in certain embodiments, the acquired initial image further includes component information of the OLED display screen 10. The electronic device 100 further includes a memory 50, and the memory 50 is configured to store prestored image information captured for the OLED display screen 10 when no image is displayed on the OLED display screen 10. The processor 40 is configured to, when the initial image is processed, remove the component information of the OLED display screen 10 from the initial image to obtain the iris image according to the prestored image information.

In at least one embodiment, when the iris camera 20 receives the infrared light reflected by the iris and outputs the initial image, if no image is displayed on the OLED display screen 10, the initial image includes the component information of the OLED display screen and iris image information. When the iris camera 20 receives the infrared light reflected by the iris and outputs the initial image, if an image is displayed on the OLED display screen 10, the initial image includes the component information of the OLED display screen 10, the iris image information and the display image information.

Since the infrared light emitted from the infrared OLED 12 may be received by the iris camera 20 only after being reflected by the iris outside the electronic device 100 and penetrating through the OLED display screen 10, the infrared light may be influenced by the component on the OLED display screen 10 (for example, the line and diode on the OLED display screen 10) when the infrared light reflected by the iris penetrates through the OLED display screen 10. When no image is displayed on the OLED display screen 10, the prestored image information captured for the OLED display screen 10 is the component information of the OLED display screen 10 contained in the initial image. When the iris camera 20 receives the infrared light reflected by the iris and outputs the initial image, if no image is displayed on the display screen, the processor 40 may remove the component information of the OLED display screen 10 in the information of the initial image according to the prestored image information stored in the memory 50 to obtain the iris image. When the iris camera 20 receives the infrared light reflected by the iris and outputs the initial image, if an image is displayed on the OLED display screen 10, the processor 40 may remove the component information of the OLED display screen 10 and display image information in the information of the initial image according to the prestored image information stored in the memory 50 and the display image information acquired by the processor 40 to obtain the iris image.

In some embodiments, the electronic device 100 further includes a processor 40. The OLED display screen 10 includes multiple pixel cells 16, and the processor 40 independently controls the multiple pixel cells 16 and the infrared OLED 12.

In at least one embodiment, each of the pixel cells 16 may include a red OLED component, a blue OLED component and a green OLED component. The red OLED component, the green OLED component and the blue OLED component may be distributed in a Bayer array. Referring to FIG. 4, the red OLED component, green OLED component and blue OLED component of the pixel cells 16 may form a 2*2 distribution. For example, the red OLED component and the green OLED component are distributed in a first row, and the green OLED component and the blue OLED component are distributed in a second row. The multiple pixel cells 16 are all configured to display image information. In a spatial structure, the infrared OLED 12 may be integrated in the pixel cells 16 or integrated at edge positions of the pixel cells 16.

When the processor 40 controls the multiple pixel cells 16 to display the image information, the processor 40 controls the infrared OLED 12 to stop working (or be turned off) to avoid influence of the infrared light emitted from the infrared OLED 12 on displaying of the image information by the pixel cells 16, thereby improving a display effect of the OLED display screen 10. When the processor 40 controls the infrared OLED 12 to emit the infrared light to assist the iris camera 20 in acquisition of the iris image, the processor 40 controls the pixel cells 16 to stop working to avoid influence of light emitted from the pixel cells 16 on acquisition of the iris image by the iris camera 20, thereby improving a definition of the iris image obtained by the iris camera 20.

In the descriptions about the specification, the descriptions made with reference to terms "certain embodiments", "an embodiment", "some embodiments", "schematic embodiments", "examples", "specific examples", "some examples" or the like refer to that specific features, structures, materials or characteristics described in combination with the embodiments or the examples are included in at least one embodiment or example of the present disclosure. In the specification, schematic expressions about the terms do not always refer to the same embodiments or examples. Moreover, the specific features, structures, materials or characteristics which are described may be combined in a proper manner in any one or more embodiments or examples.

Although the embodiments of the present disclosure have been shown and described above, it can be understood that the embodiments are exemplary and may not be understood as limits to the present disclosure. Those skilled in the art may make variations, modifications, replacements and transformations to the embodiments within the scope of the present disclosure, and the scope of the present disclosure is defined by the claims and equivalents thereof.

The invention claimed is:

1. An electronic device, comprising:
   an iris camera; and
   an organic light-emitting diode (OLED) display screen, in which an infrared OLED is integrated, wherein the infrared OLED is configured to emit infrared light to assist the iris camera in acquisition of an iris image; and the iris camera is configured to receive infrared light reflected by an iris and to generate an iris image;
   wherein the OLED display screen includes multiple pixel cells for displaying image information, wherein each of the pixel cells includes a red OLED, a blue OLED, and a green OLED; and the infrared OLED is integrated between the pixel cells or integrated at edge positions of the OLED display screen;
   wherein the red OLED, the green OLED and the blue OLED are distributed in a Bayer array.

2. The electronic device according to claim 1, further comprising a casing, wherein the OLED display screen and the iris camera are arranged on the casing and separated from each other.

3. The electronic device according to claim 1, further comprising a processor and a memory, wherein the electronic device is a full-screen display electronic device,
   the iris camera is configured to receive infrared light which is reflected by an iris and penetrates through the OLED display screen, and obtain an initial image; wherein the initial image contains iris image information corresponding to an iris image and component information of the OLED display screen;
   the memory is configured to store prestored image information captured for the OLED display screen when no image is displayed on the OLED display screen, wherein the prestored image information is the component information of the OLED display screen; and
   the processor is configured to remove the component information of the OLED display screen from the initial image according to the prestored image information stored in the memory, and obtain the iris image information to acquire the iris image.

4. The electronic device according to claim 1, further comprising a processor and a memory, wherein the electronic device is a full-screen display electronic device,
   the iris camera is configured to receive infrared light which is reflected by an iris and penetrates through the OLED display screen, and obtain an initial image; wherein the initial image contains iris image information corresponding to an iris image, component information of the OLED display screen and display image information when an image is displayed on the OLED display screen;
   the memory is configured to store prestored image information captured for the OLED display screen when no image is displayed on the OLED display screen, wherein the prestored image information is the component information of the OLED display screen; and
   the processor is configured to acquire the display image information in real time, remove the display image information from the initial image, remove the component information from the initial image according to the prestored image information stored in the memory, and obtain the iris image information to acquire the iris image.

5. The electronic device according to claim 1, wherein the infrared OLED is arranged as follows:
   the infrared OLED is integrated at a location on the OLED display screen closest to the iris camera;
   the infrared OLED is integrated at a specific distance from the iris camera; or
   the infrared OLED is integrated at an edge of the OLED display screen.

6. The electronic device according to claim 5, wherein the specific distance is 10 mm or 15 mm.

7. The electronic device according to claim 1, further comprising a processor;
   wherein the processor is configured to control the multiple pixel cells to display the image information, and control the infrared OLED to be turned off; or
   the processor is configured to control the infrared OLED to emit the infrared light, and control the pixel cells to stop working.

8. The electronic device according to claim 1, wherein the OLED display screen comprises:
   a substrate, on which the infrared OLED is arranged;
   wherein the infrared OLED comprises: a first transistor, a second transistor, a storage capacitor, a first electrode layer electrically connected with the second transistor, an organic light-emitting layer positioned on the first electrode layer and a second electrode layer positioned on a surface of the organic light-emitting layer.

9. The electronic device according to claim 8, wherein the OLED display screen is working, the first transistor acts as a switching transistor; the second transistor acts as a driving transistor; a source of the first transistor is connected to a data line, a gate of the first transistor is connected to a gate line, and a drain of the first transistor is connected to one end of the storage capacitor and a gate of the second transistor; a source of the second transistor is connected to the first electrode layer; the first electrode layer is a positive electrode of the infrared OLED; and the infrared OLED is controlled to be turned on or off under pulse signals on the data line and the gate line.

10. The electronic device according to claim 8, wherein the OLED display screen is a top-emitting type OLED display screen, or a bottom-emitting type OLED display screen,
    when the OLED display screen is the top-emitting type OLED display screen, the first electrode layer is a metal conducting layer, the second electrode layer is a transparent electrode layer, and light emitted from the organic light-emitting layer is emitted to the second electrode layer along the first electrode layer; and
    when the OLED display screen is the bottom-emitting type OLED display screen, the first electrode layer is the transparent electrode layer, the second electrode layer is the metal conducting layer, and light emitted from the organic light-emitting layer is emitted to the first electrode layer along the second electrode layer.

11. The electronic device according to claim 10, wherein the metal conducting layer is made of a metal conducting material with a high reflectivity, and the metal conducting material comprises at least one of: Platinum, Palladium, Ir, Aurum, Wolfram, Nickel, Argentum or Aluminum.

12. The electronic device according to claim 10, wherein the transparent electrode layer is made of a transparent electrode material, and the transparent electrode material comprises at least one of: Indium Tin Oxide or Indium Zinc Oxide.

13. The electronic device according to claim 8, wherein the substrate is a transparent substrate, and the substrate is formed from any one of: glass, a sapphire, polymethyl methacrylate, polycarbonate or polycarbonate/polymethyl methacrylate.

14. The electronic device according to claim 8, wherein the organic light-emitting layer is made of a triplet rare metal compound.

15. The electronic device according to claim 14, wherein the organic light-emitting layer is made of an Ir(III) compound.

16. The electronic device according to claim 1, wherein the electronic device comprises: a mobile phone, a tablet computer, a notebook computer, a smart watch, a smart band, smart glasses, or a smart helmet.

* * * * *